(12) United States Patent
Altrichter et al.

(10) Patent No.: US 6,727,693 B2
(45) Date of Patent: Apr. 27, 2004

(54) CIRCUIT CONFIGURATION AND SENSOR DEVICE

(75) Inventors: Hans Altrichter, Villach (AT); Mario Motz, Wernberg (AT)

(73) Assignee: Infineon Technologies AG, Munich (DE)

( * ) Notice: Subject to any disclaimer, the term of this patent is extended or adjusted under 35 U.S.C. 154(b) by 41 days.

(21) Appl. No.: 10/117,829

(22) Filed: Apr. 8, 2002

(65) Prior Publication Data

US 2002/0149506 A1 Oct. 17, 2002

(30) Foreign Application Priority Data

Apr. 6, 2001 (DE) .......................... 101 17 382

(51) Int. Cl.[7] .................. G01R 33/06; H03K 17/90
(52) U.S. Cl. ...................... 324/251; 327/511
(58) Field of Search ................ 324/537, 251, 324/207.2, 117, 225; 327/511, 561

(56) References Cited

U.S. PATENT DOCUMENTS

| 4,574,250 | A | | 3/1986 | Senderowicz | 330/258 |
|---|---|---|---|---|---|
| 5,107,266 | A | | 4/1992 | Kim | 341/163 |
| 5,619,137 | A | | 4/1997 | Vig et al. | 324/251 |
| 5,621,319 | A | | 4/1997 | Bilotti et al. | 324/251 |
| 6,154,027 | A | * | 11/2000 | Alexander et al. | 324/251 |
| 6,522,131 | B1 | * | 2/2003 | Hiligsmann et al. | 324/207.2 |

FOREIGN PATENT DOCUMENTS

| DE | 41 15 484 C2 | 11/1991 |
|---|---|---|
| DE | 40 30 085 A1 | 3/1992 |
| DE | 44 22 266 A1 | 1/1996 |
| DE | 44 22 867 A1 | 1/1996 |
| EP | 0 701 141 A2 | 3/1996 |

* cited by examiner

Primary Examiner—N. Le
Assistant Examiner—Donald M Lair
(74) Attorney, Agent, or Firm—Laurence A. Greenberg; Werner H. Stemer; Gregory L. Mayback

(57) ABSTRACT

The circuit configuration converts an input signal into a binary output signal. The circuit has at least one comparator, at least one demodulation unit, and at least one clock unit. The demodulation unit has two or more capacitors and two or more switches controlled by the clock unit. The switches connect the capacitors of the demodulation unit to the comparator, and the comparator compares an input signal demodulated by the demodulation unit with a reference value and forms from that the binary output signal.

15 Claims, 5 Drawing Sheets

CIRCUIT CONFIGURATION AND SENSOR DEVICE

BACKGROUND OF THE INVENTION

Field of the Invention

The present invention relates to a circuit configuration. More specifically, the invention relates to a circuit configuration for converting an input signal into a binary output signal. Furthermore, the present invention relates to a sensor device having a circuit configuration for converting an input signal into a binary output signal.

If an operational amplifier is operated without negative feedback, as shown in FIG. 6A, then a comparator is obtained. The output voltage of such a comparator is: $U_{amax}$ for $U_1 > U_2$ and $U_{amin}$ for $U_1 < U_2$ (see FIG. 6B). On account of the generally high gain of operational amplifiers, the circuit shown in FIG. 6A responds to very small voltage differences $U_1 - U_2$. It is therefore suitable for comparing two voltages with high precision. If one of the voltages $U_1$ or $U_2$ is put at a fixed reference value, then a comparator is obtained which compares an input voltage with the reference value.

Comparators are used, for example, in the evaluation of sensor signals. Sensors that are operated as switches convert the measurement quantity into an internal electrical signal and form a digital (binary) output signal by comparing the internal electrical signal with an adjustable switching threshold of the comparator used. Such an application of a comparator is shown in U.S. Pat. No. 5,619,137, for example. There, the switching threshold is set by adding bias voltages at the signal inputs of the comparator by current feed-in via resistors lying serially in the input path. However, this bias voltage generation by current feed-in functions only under the precondition that the signal voltage is made available by means of a stage with a sufficient driver capability, for example an operational amplifier or a buffer circuit.

In the evaluation of sensor signals, a demodulation of the signal is often carried out with the aid of capacitances. Particularly in the case of so-called "chopped Hall sensors", that are shown for example in U.S. Pat. No. 5,621,319, a demodulation with the aid of capacitances is customary in the signal chain of the sensors after the resistive preamplification.

FIG. 5 shows this aspect of the embodiment disclosed in U.S. Pat. No. 5,621,319. The signals from a Hall element H are amplified by an operational amplifier V and passed via switches to capacitors. The signals are subsequently passed via the driver stages V1, V2, V3 and V4 to an adder comprising the resistors R1 and the amplifier K. For compensation of an offset voltage that forms in the Hall element H, the direction of the Hall current $I_H$ through the Hall element H is periodically altered, which is indicated by the phases $\phi 1$ and $n\phi 1$.

In the evaluation of sensor signals, it is desirable to be able to ensure the lowest possible power consumption of the entire circuit. If a comparator is used in the evaluation of sensor signals, then it is furthermore desirable to be able to ensure the most accurate possible comparison of the internal signal with the preset threshold of the comparator. However, as a result of the driver stages that are conventionally used, for example the driver stages V1, V2, V3 and V4 in U.S. Pat. No. 5,621,319 or the driver stage used in the above-mentioned U.S. Pat. No. 5,619,137, for setting the comparator threshold, the operation of such circuits has hitherto been wherein by a relatively high current consumption and a relatively large inaccuracy due to the offset voltages associated with the driver stages.

SUMMARY OF THE INVENTION

It is accordingly an object of the invention to provide a circuit configuration for converting an input signal into a binary output signal which overcomes the above-mentioned disadvantages of the heretofore-known devices and methods of this general type and which reduces or completely avoids the disadvantages of the prior art and, specifically, which has a small current consumption and preferably a small offset error. It is a further, specific object to provide a correspondingly improved sensor device.

With the foregoing and other objects in view there is provided, in accordance with the invention, a circuit configuration for converting an input signal into a binary output signal, comprising:

a comparator;

a clock unit;

a demodulation unit having a plurality of (at least two) capacitors and a plurality of (at least two) switches controlled by the clock unit, the switches connecting the capacitors of the demodulation unit to the comparator and connecting the capacitors to one another; and the comparator comparing an input signal demodulated by the demodulation unit with at least one reference value and generating the binary output signal.

In other words, the invention provides a circuit configuration for converting an input signal into a binary output signal which has at least one comparator, at least one demodulation unit and at least one clock unit, wherein the demodulation unit has at least one capacitor and at least one switch controlled by the clock unit, which connects the capacitor of the demodulation unit to the comparator, and the comparator compares an input signal demodulated by the demodulation unit with at least one reference value and forms the binary output signal.

With the above and other objects in view there is also provided, in accordance with the invention, a sensor device, comprising:

at least one sensor unit for converting a measurement quantity into an electrical signal; and at least one circuit configuration as outlined above connected to receive the electrical signal and to convert the electrical signal into a binary output signal.

In accordance with a preferred embodiment of the invention, the sensor unit has at least one Hall element and at least one amplifier stage connected between the Hall element and the circuit configuration.

That is, the invention furthermore provides a sensor device having at least one sensor unit for converting at least one measurement quantity into at least one electrical signal and at least one circuit configuration for converting the electrical signal into at least one binary output signal. The sensor device according to the invention is wherein a circuit configuration according to the invention is provided as the circuit configuration for converting the electrical signal into at least one binary output signal.

The circuit configuration according to the invention has the advantage that the driver stages provided in the prior art are avoided, as a result of which the current consumption of the circuit configuration, the required chip area and the offset errors associated with the driver stages can be significantly reduced.

In accordance with one preferred embodiment, the comparator has an input stage and at least one amplifier stage. In this case, it is particularly preferred if the input stage has at least one differential amplifier.

In accordance with a further preferred embodiment, at least one reference value unit is provided, which provides at least one reference value for the comparator. In this case, it is preferred if the reference value unit has at least one current source. Furthermore, it is particularly preferred if the reference value unit is connected to a reference value input of the comparator. Consequently, the switching threshold of the comparator is not generated by current feed-in in the input path of the comparator upstream of the comparator but rather, from the point of view of the demodulation unit, in the comparator itself. The threshold setting is integrated into the comparator in this sense.

In accordance with a further preferred embodiment, provision is made of at least one unit for the offset adjustment of the comparator. From the point of view of the demodulation unit, a comparator with self-adjustment is thus produced, as a result of which the input stage of the comparator can be dimensioned to be small, so that the signal is essentially not impaired when the capacitances of the demodulation unit are switched in to the comparator. The normally increased offset values from small input stages are virtually entirely eliminated by the unit for offset adjustment of the comparator. Accordingly, the offset error of the comparator is virtually completely eliminated and the overall accuracy of the signal chain is improved. In accordance with a further preferred embodiment, the input capacitance of the signal input of the comparator is less than 20%, preferably less than 10%, of the sum of the capacitances of the capacitors of the demodulation unit at the signal input.

In accordance with a further preferred embodiment, the unit for offset adjustment is connected to the input stage. Furthermore, it is preferred if the unit for offset adjustment has at least one current source. Moreover, it is particularly preferred if the unit for offset adjustment is controlled by the clock unit. In this case, it is particularly preferred if the clock unit controls the switch of the demodulation unit and the unit for offset adjustment in such a way that an offset adjustment of the comparator is carried out while the switch is open.

The offset adjustment is thus preferably carried out before the comparison of the demodulated input signal with the reference value at a point in time at which the comparator is not yet being used. Accordingly, it is preferred if the control signals required for the circuit configuration according to the invention are reduced to two essential signal types, since, preferably, the sample phase of the demodulation unit (switch open) corresponds to the offset adjustment phase of the comparator and the demodulation phase of the demodulation unit (switch closed) corresponds to the comparison phase of the comparator.

Other features which are considered as characteristic for the invention are set forth in the appended claims.

Although the invention is illustrated and described herein as embodied in a circuit configuration and sensor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
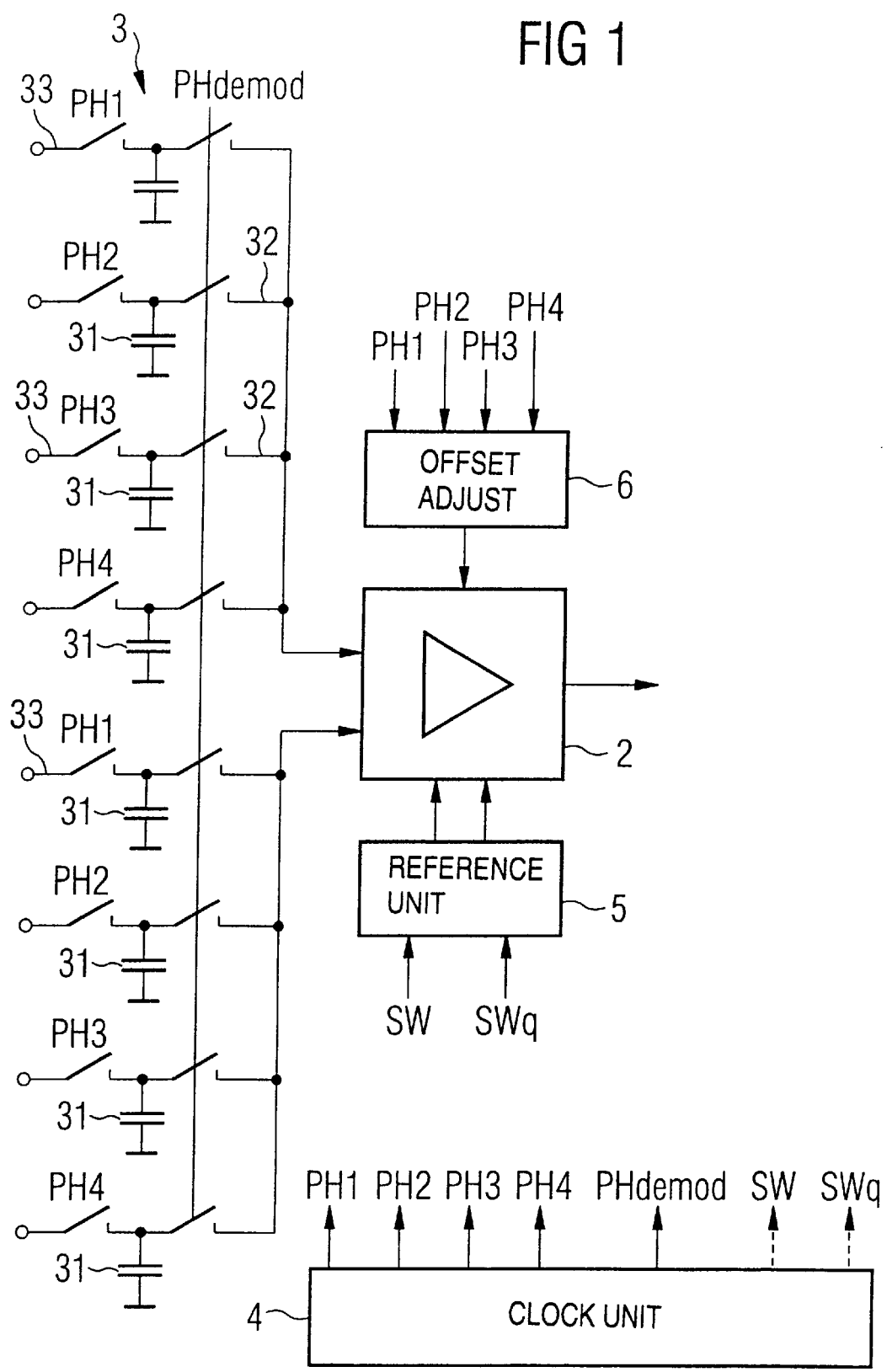
FIG. 1 is a diagrammatic illustration of an embodiment of a circuit configuration according to the invention for converting an input signal into a binary output signal.

Referring now to the figures of the drawing in detail and first, particularly, to FIG. 1 thereof, there is shown a diagrammatic illustration of a first embodiment of a circuit configuration according to the invention for converting an input signal into a binary output signal. The circuit configuration 1 according to the invention for converting an input signal into a binary output signal comprises a comparator 2, a demodulation unit 3 and a clock unit 4. In the present example, the demodulation unit 3 comprises eight capacitors 31, which are in each case directly connected to the comparator 2 via the switches 32. Furthermore, the demodulation unit 3 has the switches 33, which connect the capacitors 31 to the input signals.

The clock signal PHdemod, which is generated by the clock unit 4, is provided for controlling the switches 32. Furthermore, the clock unit 4 generates the clock signals PH1, PH2, PH3 and PH4, which control the switches 33. Under the control of the clock unit 4, the demodulation unit thus carries out a demodulation of the input signals and passes the demodulated signals to the comparator 2. Afterwards, the comparator 2 compares the demodulated input signals with a reference value and forms the binary output signal.

The circuit configuration according to the invention has the advantage that the driver stages provided in the prior art are avoided, as a result of which the current consumption of the circuit configuration, the required chip area and the offset errors associated with the driver stages can be significantly reduced.

In the circuit configuration shown in FIG. 1, a reference value unit 5 is provided for setting the comparator threshold. The reference value unit 5 provides two reference values for the comparator 2 in the present example. Furthermore, in the circuit configuration shown in FIG. 1, provision is made of a unit 6 for offset adjustment of the comparator 2. From the point of view of the demodulation unit 3, a comparator 2 with self-adjustment is thus produced, as a result of which the input stage of the comparator can be dimensioned to be small, so that the signal is essentially not impaired when the capacitances of the demodulation unit 3 are switched in to the comparator 2. In particular, it is possible in this way to prevent a discharge of the signal-carrying voltages on the demodulation capacitances.

In the present example, the input capacitance of the comparator 2 is chosen to be less than 10% of the sum of the capacitances of the capacitors 31 of the demodulation unit 3. The normally increased offset values from small input stages are virtually entirely eliminated by the unit 6 for offset adjustment of the comparator. Accordingly, the offset error of the comparator 2 is virtually completely eliminated and the overall accuracy of the signal chain is improved.

Figure 2:
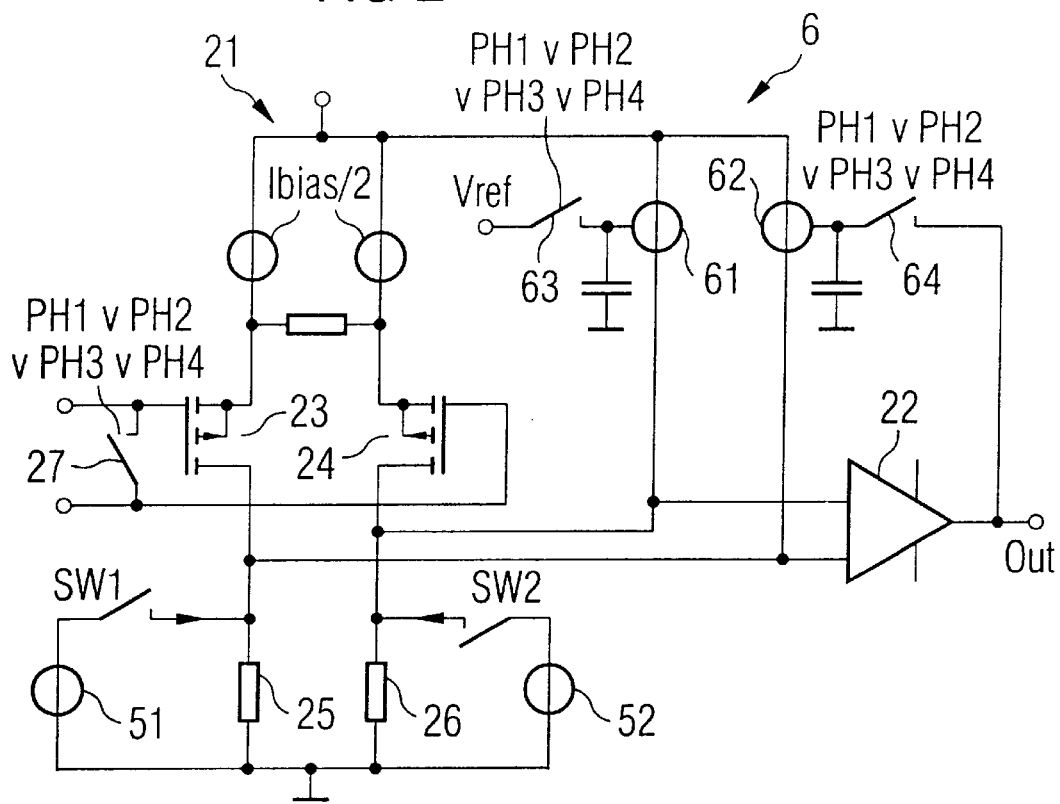
FIG. 2 is a schematic diagram of the comparator, the unit for offset adjustment, and the reference value unit of FIG. 1.

Referring now to FIG. 2, there is provided a more detailed view of the comparator 2, the unit 6 for offset adjustment and the reference value unit 5 from FIG. 1.

As can be seen from FIG. 2, the comparator 2 has an input stage 21 and an amplifier stage 22. The input stage 21 is thereby constructed as a differential amplifier with the transistors 23 and 24. The transistors 23 and 24 are connected to a reference-ground potential, for example ground, via respective resistors 25 and 26. Terminals which connect the input stage 21 to the reference value unit 5 are arranged between the transistor 23 and the resistor 25 and between the transistor 24 and the resistor 26. Furthermore, a switch 27 is provided upstream of the transistors 23 and 24. The switch 27 short-circuits the two signal inputs of the comparator under the control of the clock unit 4.

The reference value unit 5 comprises two current sources 51 and 52 and also the switches SW1 and SW2. In this case, the switches SW1 and SW2 are controlled by the clock signals SW and SWq. The clock signals SW and SWq are likewise generated by the clock unit 4. If the clock signal SW is active and the switch SW1 is thus closed, the current source 51 impresses a current into the resistor 25, thereby producing a voltage drop across the resistor 25. This voltage drop leads to the setting of a first reference value for the comparator 2. If the clock signal SWq is active and the switch SW2 is thus closed, the current source 52 impresses a current into the resistor 26, thereby producing a voltage drop across the resistor 26. This voltage drop leads to the setting of a second reference value for the comparator 2. Consequently, the switching threshold of the comparator is not generated by current feed-in in the input path of the comparator upstream of the comparator, but rather, from the point of view of the demodulation unit, in the comparator itself. The threshold setting is integrated into the comparator in this sense.

The provision of two reference values for the comparator 2 makes it possible, assuming a corresponding non-illustrated evaluation logic, to achieve a significantly improved suppression of disturbances in the signal processing. A corresponding circuit configuration is shown and described in a commonly assigned German patent application, DE 101 17 383.0, filed on Apr. 6, 2001 in the German Patent Office, the contents of which are hereby incorporated by reference. In the present embodiment, the unit 6 for offset adjustment is connected to the input stage 21 of the comparator 2. As can be seen from FIG. 2, the unit 6 for offset adjustment has two voltage-controlled current sources 61 and 62, which are controlled via the switches 63 and 64. The switches 63 and 64 are in turn controlled by the clock unit 4.

Figure 3:
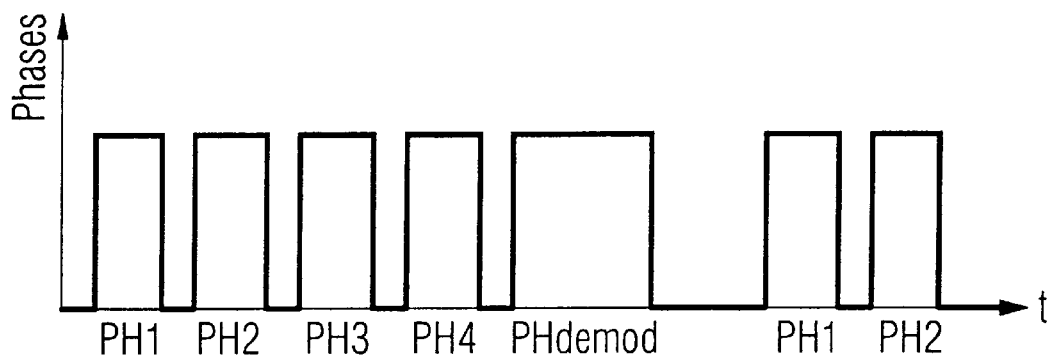
FIG. 3 is a diagrammatic graph of the temporal sequence of the clock signals PH1, PH2, PH3, PH4, and Phdemod.

In the present embodiment, the switches 27, 63, and 64 are in each case closed if one of the clock signals PH1, PH2, PH3 or PH4 is active. Furthermore, the clock signal PHdemod has no overlap with the clock signals PH1, PH2, PH3 or PH4 (see FIG. 3). Accordingly, an offset adjustment of the comparator is carried out whenever the demodulation unit is in a sample phase. The offset adjustment is thus preferably carried out before the comparison of the demodulated input signal with the reference value at a point in time at which the comparator is not yet being used. Accordingly, the control signals required for the circuit configuration according to the invention can be reduced to two essential signal types, since, preferably, the sample phase of the demodulation unit (clock signals PH1, PH2, PH3 or PH4 active and clock signal PHdemod inactive) corresponds to the offset adjustment phase of the comparator and the demodulation phase of the demodulation unit (clock signals PH1, PH2, PH3 or PH4 inactive and clock signal Phdemod active) corresponds to the comparison phase of the comparator 2.

Figure 4:
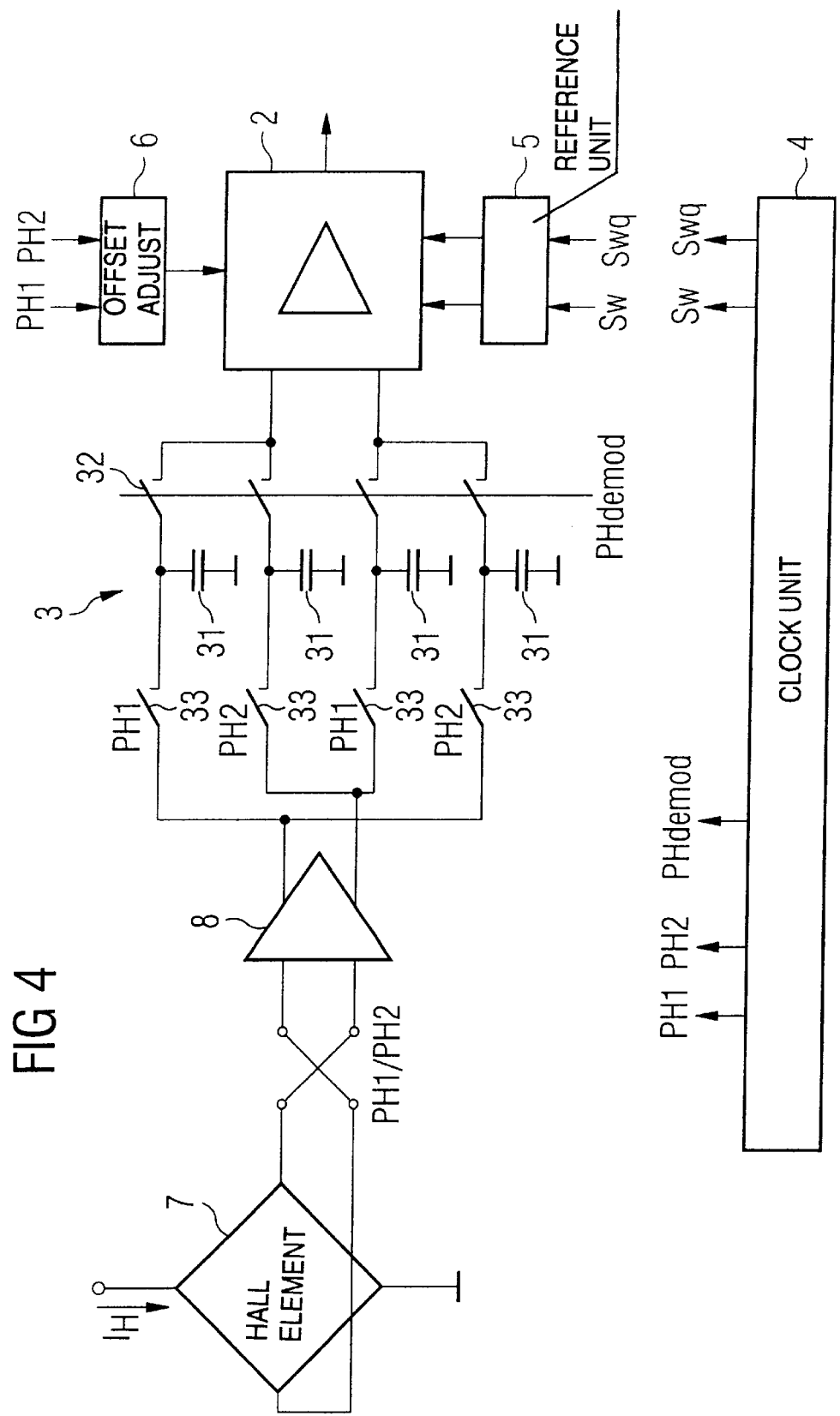
FIG. 4 is a schematic block diagram of an embodiment of a sensor device according to the invention.
Figure 5:
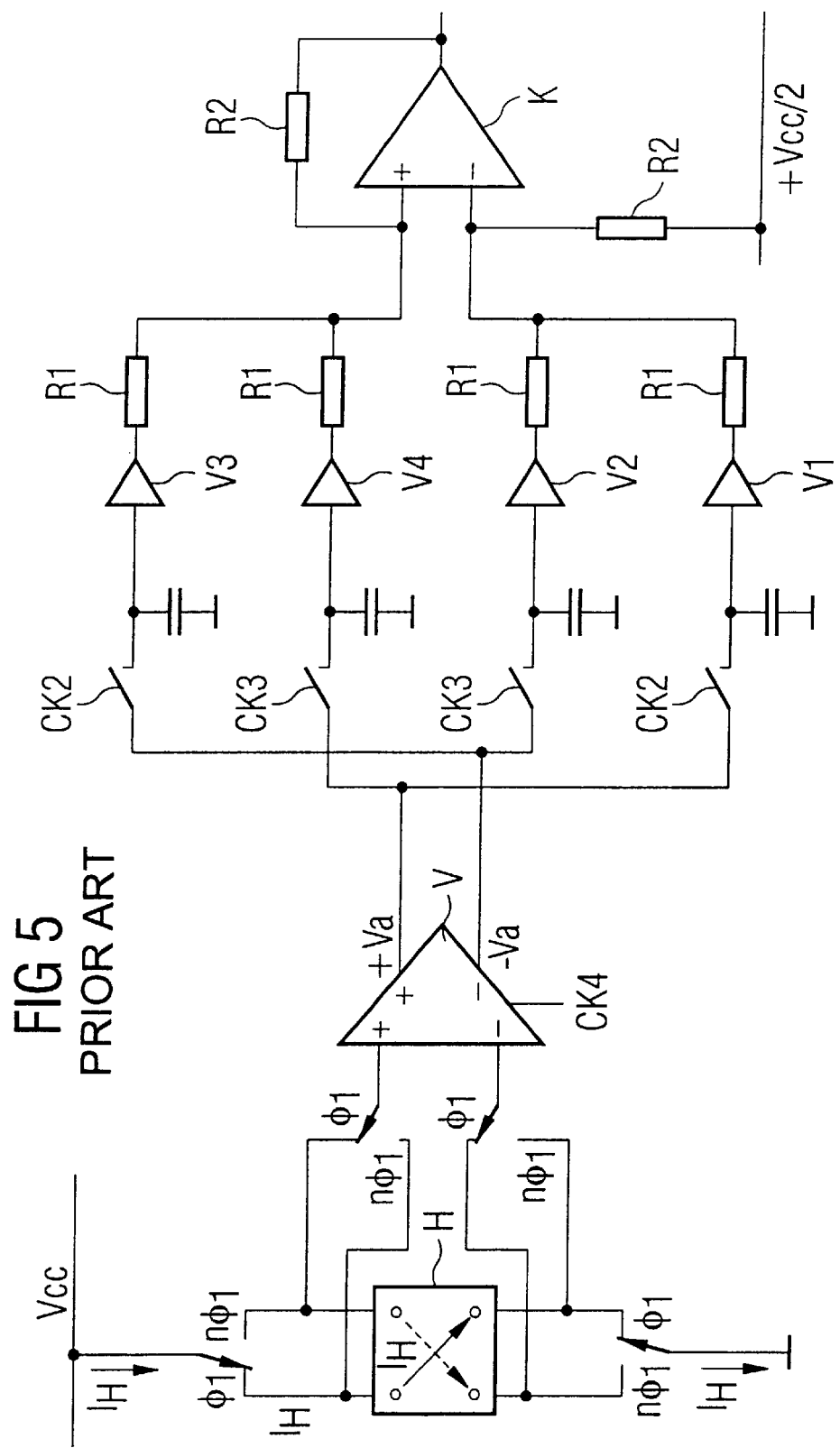
FIG. 5 is a schematic block diagram of a sensor device according to the prior art.
Figure 6A:
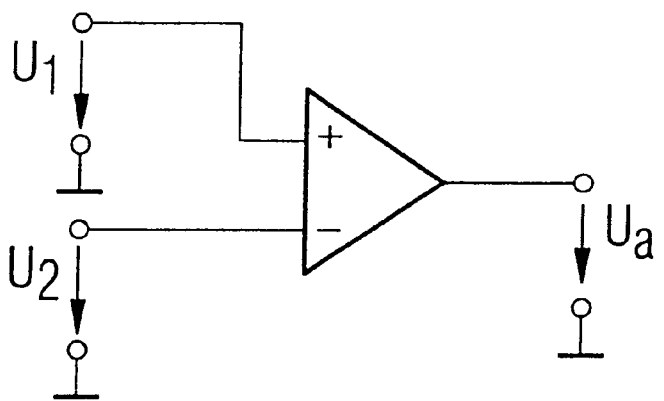
FIG. 6A is a diagrammatic illustration of a comparator according to the prior art (U.S. Pat. No. 5,621,319)
Figure 6B:
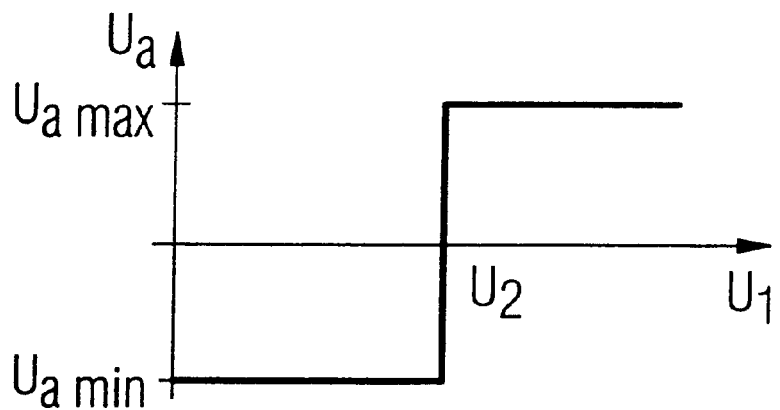
FIG. 6B is a diagrammatic graph of the transfer characteristic of the comparator in FIG. 6A.

FIG. 4 shows a diagrammatic illustration of an embodiment of a sensor device according to the invention. The sensor device according to the invention comprises a circuit configuration according to the invention for converting an input signal into a binary output signal, a Hall element 7 and also an amplifier unit 8. As already explained, the circuit configuration according to the invention comprises a comparator 2, a demodulation unit 3 and a clock unit 4. In the present example, the demodulation unit 3 comprises four capacitors 31, which are in each case directly connected to the comparator 2 via the switches 32. Furthermore, the demodulation unit 3 has the switches 33, which connect the capacitors 31 to the input signals.

The Hall element 7 measures a magnetic field by a so-called "Hall current $I_H$" being passed through the Hall element 7, which results in a so-called "Hall voltage" depending on the strength of the magnetic field. The Hall voltage is passed as input signal via the amplifier stage 8 to the circuit configuration according to the invention. In this case, the Hall voltage is subjected to offset correction by means of the so-called "chopping" (pulsed operation) of the Hall element 7 and the amplifier stage 8 and the subsequent modulation with the aid of the capacitances 31.

We claim:

1. A circuit configuration for converting an input signal into a binary output signal, comprising:
   a comparator;
   a clock unit;
   a demodulation unit having a plurality of capacitors and a plurality of switches controlled by said clock unit, said switches connecting said capacitors of said demodulation unit to said comparator and connecting said capacitors to one another; and
   said comparator comparing an input signal demodulated by said demodulation unit with at least one reference value and generating the binary output signal.

2. The circuit configuration according to claim 1, wherein said comparator has an input stage and an amplifier stage.

3. The circuit configuration according to claim 2, wherein said input stage includes a differential amplifier.

4. The circuit configuration according to claim 1, which further comprises a reference value unit connected to and supplying to said comparator at least one reference value.

5. The circuit configuration according to claim 4, wherein said reference value unit comprises at least one current source.

6. The circuit configuration according to claim 4, wherein said reference value unit is connected to a reference value input of said comparator.

7. The circuit configuration according to claim 1, which further comprises a unit for offset adjustment of said comparator.

8. The circuit configuration according to claim 7, wherein said unit for offset adjustment is connected to said input stage.

9. The circuit configuration according to claim 7, wherein said unit for offset adjustment comprises at least one current source.

10. The circuit configuration according to claim 7, wherein said unit for offset adjustment is connected to and controlled by said clock unit.

11. The circuit configuration according to claim 10, wherein said clock unit is connected to control said switch of said demodulation unit and said unit for offset adjustment such that an offset adjustment of said comparator is carried out while said switch is open.

12. The circuit configuration according to claim 1, wherein an input capacitance of a signal input of said comparator is less than 20% of a sum of the capacitances of said capacitors of said demodulation unit at the signal input.

13. The circuit configuration according to claim 1, wherein an input capacitance of a signal input of said comparator is less than 10% of a sum of the capacitances of said capacitors of said demodulation unit at the signal input.

14. A sensor device, comprising:
  at least one sensor unit for converting a measurement quantity into an electrical signal; and
  at least one circuit configuration according to claim 1 connected to receive the electrical signal and to convert the electrical signal into a binary output signal.

15. The sensor device according to claim 14, wherein said sensor unit has at least one Hall element and at least one amplifier stage connected between said Hall element and said circuit configuration.

* * * * *